United States Patent [19]

Prabhu et al.

[11] Patent Number: 4,880,567
[45] Date of Patent: Nov. 14, 1989

[54] THICK FILM COPPER CONDUCTOR INKS

[75] Inventors: Ashok N. Prabhu, E. Windsor Township, Mercer Country; Kenneth W. Hang, W. Windsor Township, Mercer County; Edward J. Conlon, Princeton Township, Mercer County, all of N.J.

[73] Assignee: General Electric Company, Schenectady, N.Y.

[21] Appl. No.: 281,605

[22] Filed: Dec. 9, 1988

Related U.S. Application Data

[62] Division of Ser. No. 87,556, Aug. 20, 1987, Pat. No. 4,816,615.

[51] Int. Cl.$^4$ .............................................. H01B 1/06
[52] U.S. Cl. ..................... 252/512; 252/518; 252/521; 106/1.13; 106/1.18; 501/19; 501/63; 501/69; 501/79; 501/70
[58] Field of Search ............... 252/512, 518, 521, 517; 361/305, 411; 174/68.5; 106/1.13, 1.18, 20; 501/24, 19, 21, 26, 55, 63, 68, 69, 70, 79, 22

[56] References Cited

U.S. PATENT DOCUMENTS

| | | | |
|---|---|---|---|
| 4,376,725 | 3/1983 | Prabhu et al. | 252/512 |
| 4,385,127 | 5/1983 | Chyung | 501/5 |
| 4,415,624 | 11/1983 | Prabhu et al. | 428/209 |
| 4,521,329 | 6/1985 | Suita et al. | 252/512 |
| 4,514,321 | 4/1985 | Suita | 252/512 |
| 4,623,482 | 11/1986 | Kuo et al. | 252/512 |
| 4,816,615 | 3/1989 | Prabhu et al. | 252/512 X |

*Primary Examiner*—Josephine Baer
*Attorney, Agent, or Firm*—Mary Ann Montebello; James C. Davis, Jr.; William H. Pittman

[57] ABSTRACT

Improved copper conductor inks useful in the fabrication of multilevel circuits are disclosed. The inks comprise copper powder, a devitrifying glass frit selected from a zinc-calcium-aluminum-silicate glass frit, a zinc-magnesium-barium-aluminum-silicate glass frit and mixtures thereof, an adhesion promoting oxide, and a suitable organic vehicle. These inks are particularly adapted for applications where superior adhesion between the copper conductor ink and the underlying substrate or dielectric film is required.

6 Claims, No Drawings

THICK FILM COPPER CONDUCTOR INKS

This application is a division of application Ser. No. 087,556 filed Aug. 20, 1987, now U.S. Pat. No. 4,816,615.

This invention relates to thick film cooper conductor inks with improved adhesion and their use in fabricating multilayer electrical circuit structures.

BACKGROUND OF THE INVENTION

Multilayer thick film circuits are used as a reliable means of interconnecting high speed, high density integrated circuit packages. These circuits are typically constructed by screen printing and firing alternate conductor and dielectric ink layers on a suitable substrate. The conductor layers are interconnected by depositing a conductor material in the vias of the dielectric layer. The conductor layers are typically fabricated from precious metal conductor inks employing gold, platinum, palladium, or silver, and a low softening point vitreous glass. These conductor inks are very expensive because of the use of the precious metal and, in the case of silver, are susceptible to severe electrolytic migration. The dielectric ink which is used to separate the conductor layers is typically a low softening point vitreous glass frit containing suitable ceramic fillers.

As an alternative to the precious metal conductor inks, copper conductor inks are finding increased use in the electronics industry. Copper is an inexpensive raw material which possesses excellent properties, such as high electrical and thermal conductivities, excellent solderability, and a lower electrolytic migration tendency when compared to silver. The typical copper conductor inks also employ low softening point vitreous glass frits.

Multilayer circuit structures which utilize copper as a conductor material do experience certain problems. The most common failure is caused by the development of electrical shorts due to the interactions between the flux materials of the copper conductor ink and the dielectric ink which take place during the multiple firing steps used to fabricate the multilayer circuit structure. Copper oxide, which forms upon the exposure of the conductor ink to air or an oxidizing media, forms an eutectic mixture with the flux materials of the conductor inks, such as lead oxide and bismuth oxide. This eutectic flux phase migrates through the porous dielectric material, particularly if it contains large modifier ions, such as lead, barium and bismuth. The eutectic flux phase forms a conductive path through the dielectric which shorts the adjacent copper conductive layers.

Copper conductor inks, as well as the dielectric inks, are also susceptible to the entrapment of gaseous materials formed during the repeated firing steps. The organic vehicle used to give the copper conductor or dielectric inks the proper rheology for screen printing outgases during the firing steps. This outgassing organic material can cause both blistering and peeling of the deposited thick films. Outgassing is also responsible for increasing the porosity of the dielectric film which further aggravates the eutectic flux phase migration problem.

Attempts have been made to reduce the above-mentioned problems by formulating dielectric inks which have reduced porosity.

Another approach is to treat both the dielectric and copper conductor inks with an oxidizing or reducing plasma prior to firing. This technique is described in commonly assigned U.S. Pat. No. 4,619,836, entitled "Method Of Fabricating Thick Film Electrical Components", issued Oct. 28, 1986. The plasma treatment removes the carboneous residue of the organic vehicle which is present in conventional ink formulations.

A third approach to both the shorting and blistering problems encountered in conventional copper conductor inks is disclosed by Applicants in their commonly assigned copending U.S. patent application Ser. No. 914,303, entitled "Thick Film Copper Conductor Inks", filed Oct. 2, 1986. Improved copper conductor inks containing devitrifying glass frits are disclosed in this application. These copper conductor inks avoid the use of typical low melting point oxide fluxes, such as lead oxide and bismuth oxide. Since these flux materials are not employed, the eutectic flux phase normally formed with copper oxide is not present and the electrical shorting problem is eliminated. Additionally, since a high softening point devitrifying glass frit is used in the copper conductor inks, the organic vehicles are allowed to outgas before the ink begins to significantly flow and densify.

A need has now developed for inks similar to that disclosed in Applicants' copending application which have increased adhesion.

SUMMARY OF THE INVENTION

Improved copper conductor inks with increased adhesion contain a devitrifying glass frit selected from a zinc-calcium-aluminum-silicate glass frit, a zinc-magnesium-barium-aluminum-silicate glass frit and mixtures thereof along with the addition of an adhesion promoting oxide. These inks are found to possess excellent adhesion. The copper inks of this invention are utilized in the fabrication of multilayer circuit structures.

DETAILED DESCRIPTION OF THE INVENTION

The copper powder utilized in the conductor inks of the present invention is pure copper having a particle size from about 1 to 5 micrometers. The copper powder comprises from about 65 to about 85, preferably from about 75 to about 80, weight percent of the conductor ink composition. The zinc-calcium-aluminum-silicate glass frit of the ink of the present invention is disclosed in a dielectric ink of copending commonly assigned U.S. patent application Ser. No. 914,301 entitled "Dielectric Inks For Multilayer Copper Circuits" to Hang et al., filed Oct. 2, 1986. The devitrifying zinc-calcium-aluminumsilicate glass frit comprises, on a weight basis:

a) from about 7 to about 12, preferably from about 8 to about 10, percent of zinc oxide;

b) from about 25 to about 45, preferably from about 29 to about 38, percent of calcium oxide;

c) from about 10 to about 20, preferably from about 11 to about 18.5, percent of aluminum oxide;

d) from about 35 to about 50, preferably from about 37 to about 44 percent of silicon oxide;

e) from 0 to about 2, preferably from about 0.5 to about 1, percent of phosphorus pentoxide; and f) from about 0 to about 5, preferably from about 2 to about 3, percent of zirconium silicate.

The zinc-magnesium-barium-aluminum-silicate glass frit of the conductive ink of this invention is similar to a glass frit employed in the dielectric ink of commonly assigned copending U.S. patent application Ser. No. 914,302 to Hang et al., entitled "Dielectric Inks For Multilayer Copper Circuits", filed Oct. 2, 1986. The devitrifying zinc-magnesium-barium-aluminum-silicate glass frit employed in the present invention comprises, on a weight basis:

a) from about 15 to about 25, preferably from about 16 to about 22, percent of zinc oxide;

b) from about 10 to about 25, preferably from about 16 to about 22, percent of magnesium oxide;

c) from about 3 to about 12, preferably from about 5 to about 10, percent of barium oxide;

d) from about 5 to about 20, preferably from about 8 to about 11, percent of aluminum oxide;

e) from about 35 to about 50, preferably from about 39 to about 43, percent of silicon dioxide;

f) from 0 to about 3, preferably from about 1 to about 2, percent of phosphorus pentoxide; and g) from 0 to about 5, preferably from about 2 to about 3, percent of zirconium silicate.

The devitrifying glass frits may be used individually or combined in any proportion and comprise from about 2 to about 10, preferably from about 2.5 to about 5, percent by weight of the copper conductor ink composition.

These devitrifying glass frits used in the copper conductor inks of the present invention are particularly advantageous in that they have a very high softening temperature, i.e. they do not begin to flow until the furnace temperature is above 700° C. Since the dried ink layers remain permeable to the passage of gaseous materials until they begin to significantly flow and densify, these frits provide extra time in the furnace where the organi vehicle may be outgassed. Because the high softening temperature of the glass frit provides efficient removal of the carboneous residues from the dried ink, it is not necessary to treat the inks of the present invention before firing in an oxidizing or reducing plasma as described in U.S. Pat. No. 4,619,836. A further advantage of the glass frits used in the copper conductor inks of the present invention is that their thermal coefficients of expansion are close to that of alumina. This makes these inks very useful on alumina circuit boards, especially multilayer applications where the structure is repeatedly heated and cooled.

The most unexpected advantage of the devitrifying glass frits used in both the present invention and in the dieectric layers of U.S. patent application Ser. Nos. 914,301 and 914,302 is that a conventional adhesion promoting oxide can be utilized in the copper conductor inks without the formation of electrical shorts. Copper conductor inks of the present invention contain, on a weight basis, from about 1 to about 8 percent of an adhesion promoting oxide. Suitable adhesion promoting oxides are selected from the group consisting of bismuth oxide, cadmium oxide, cuprous oxide, thallium oxide, lead oxide and mixtures thereof. Preferably, the copper conductor inks of the present invention contain from about 0.5 to about 5 percent by weight bismuth oxide and from about 0.5 to about 3 percent by weight cuprous oxide. The bismuth oxide and cuprous oxide still form an eutectic flux phase in the conductor layer. However, when the devitrifying glass frits used in the present invention are also used in the dielectric layer, the dielectric layer becomes highly resistant to the migration of the flux phases out of the copper conductive layer. This can be attributed to the fact that these dielectric layers employing these devitrifying glass frits are very dense, have superior reheat stability, and exhibit immiscibility to the flux phases. The copper conductor inks of this invention have increased adhesion when compared to the copper conductor inks disclosed in the aforementioned U.S. patent application Ser. No. 914,303.

A still further advantage of the use of devitrifying glass frits employed in the conductor inks of the present invention is that they possess a thermal expansion coefficient which is close to that of alumina. Thus, the copper conductor inks of the present invention are specifically formulated for use on alumina circuit boards or other circuit boards having similar coefficients of thermal expansion. This feature is important when multilayer circuit structures are formed since the initial layers of the copper conductor ink and dielectric ink are exposed to multiple heating and cooling cycles when each additional ink layer is applied.

The organic vehicles used to apply the copper conductor inks of the present invention are solutions of resin binders such as, for example, cellulose derivatives, particularly ethyl cellulose, synthetic resins such as polyacrylates, polymethacrylates, polyesters, polyolefins and the like in a suitable solvent. A preferred binder is poly(isobutylmethacrylate). In general, conventional solvents utilized in inks of the type described herein may be used. Preferred commercially available solvents include, for example, pine oil, terpineol, butyl carbitol acetate, 2,2,4-trimethyl-1, 3-pentanediol monoisobutyrate, available from Texas Eastman Company under the trademark Texanol and the like. The vehicles suitably contain from about 2 to about 25 percent by weight of the resin binder.

The above resin binders may be utilized individually or in any combination of two or more. A suitable viscosity modifier can be added to the resin material if desired. Such a modifier can be, for example, a castor oil derivative available from N. L. Industries under the trademark Thixatrol.

The vehicles of the subject inks may also contain up to about 25, preferably from about 10 to about 20, percent by weight, based on the vehicle, of a suitable wetting agent of the type conventionally used in copper conductor inks to aid in coating the particles of copper powder with the organic vehicle. As is the case with all components of the organic vehicle, the wetting agent must fire cleanly in nitrogen, i.e. without leaving a carbonaceous residue. A preferred wetting agent is a dispersion of a complex multifunctional, aliphatic hydrocarbon in an aliphatic hydrocarbon oil available under the trademark Hypothiolate 100 from Central Compounding Company, Chicago, Ill. The vehicles also suitably contain from about 0.5 to about 10, preferably from about 1 to about 3, percent by weight of a surfactant such as oleylamine, available as Armeen O, a high molecular weight N-alkyl-1, 3-diaminopropane dioleate, available as Duomeen TDO, both from AKZO Chemie America, or a carboxylic acid salt surface active agent, available under the trademark Troysol 98C from Troy Chemical Corp. The organic vehicle comprises from about 5 to about 25 percent preferably from about 12 to about 16 percent, by weight, of the subject inks. Regardless of the vehicle utilized, it is important that the homogeneity of the ink be maximized. Therefore, mixing is suitably carried out in a conventional apparatus which mixes in combination with subjecting the dispersion to high shearing action.

The improved copper conductor inks of this invention are applied to the substrate structures by conventional means, e.g. screen printing, brushing, spraying and the like, with screen printing being preferred. The coating of ink is dried in air at 100°-125° C. for about 15 minutes. The resulting film is then fired in nitrogen at 850° to 950° C. for from 4 to 10 minutes to form copper conductors comprising from about 75 to about 95 percent by weight of the copper powder, from about 2 to about 12 percent by weight of the glass frit and from 1 to 10 percent by weight of an adhesion promoting oxide. The subject inks are most suitably utilized for buried layers of copper conductor in a multilayer circuit in view of their compatibility with conventional boards and the improved dielectric inks described herein.

To further increase the adhesion of the copper conductor inks of the present invention to conventional alumina circuit boards, a dielectric precoat is considered to be beneficial in that it enhances the adherence of the copper conductor ink and virtually eliminates the possibility of separation from the substrate during subsequent firings. In general, a thin coating of dielectric material, i.e. from about 10 to 20 micrometers, is contemplated herein. Suitably, such a coating is uniformly deposited on the substrate as an initial step in the formulation of multilayer circuits. Although the choice of a dielectric material is not particularly critical, other than a requirement that it have an expansion coefficient close to that of the circuit board, it is preferred that a dielectric ink be utilized that is based on the glass frits of the subject copper conductor ink. Such inks are disclosed in the aforementioned Hang et al. U.S. patent applications Ser. Nos. 914,301 and 914,302. Such dielectric inks generally comprise from about 50 to about 75 percent by weight of the glass frit, up to about 30 percent by weight of a suitable ceramic filler and from about 15 to about 30 percent by weight of a suitable organic vehicle. Suitable ceramic fillers include alumina powder ($Al_2O_3$), barium dimagnesium disilicate ($BaMg_2Si_2O_7$), dimagnesium borate ($Mg_2B_2O_5$), zirconium silicate ($ZrSiO_4$), dimagnesia silicate ($2MgO-SiO_2$), dimagnesia dialumina pentasilicate ($2MgO-2Al_2O_3 \cdot 5SiO_2$) and mixtures thereof.

Copper conductor layers formed from the inks of this invention are advantageous in that they demonstrate good conductivity and resistance to oxidation. In addition, copper conductor layers formed from the inks of this invention possess excellent compatibility with improved dielectric materials such as those described in the aforementioned U.S. patent application Ser. Nos. 914,301 and 914,302.

The present invention also includes a multilayer circuit structure, particularly an integrated circuit, formed on a suitable substrate, such as alumina. This structure contains at least two patterned layers of the copper conductor inks with the layers being separated by dielectric layer having vias formed therein. The copper conductor layers are electrically interconnected by filling the vias with copper. The copper conductors comprise, on a weight basis:

a) from about 75 to about 95 percent of copper powder;

b) from about 2 to about 12 percent of a devitrifying glass frit selected from the group consisting of a zinc-calcium-aluminum silicate glass frit, a zinc-magnesium barium-aluminum-silicate glass frit and mixtures thereof; and c) from about 1 to about 10 percent of an adhesion promoting oxide.

The glass frits of the copper conductor on the multilayers circuit structure have the same compositional makeup as described earlier with regard to the copper conductor inks. The copper conductor comprises, in addition to the copper powder and the devitrifying glass frit, a mixture of bismuth oxide and cuprous oxide as the adhesion promoting oxide used to increase the adhesion of the conductor to the underlying substrate or dielectric layer. Preferably, the copper conductor comprises from about 0.5 to about 6 percent by weight bismuth oxide and from about 0.5 to about 3.5 percent by weight cuprous oxide.

The following example further illustrates the invention; however, it should be understood that the invention is in no way intended to be limited to the details described therein. In the Example, all parts and percentages are on a weight basis and all temperatures are in degrees Celsius unless otherwise stated.

EXAMPLE

Several copper conductor inks were prepared using the formulations shown in the Table. In all of the formulations the devitrifying glass frit comprised, on a weight basis: 21.81 percent zinc oxide; 19.25 percent magnesium oxide; 5.88 percent barium oxide; 9.38 percent of aluminum oxide; 39.68 percent silicon dioxide; 2.00 percent phosphorus pentoxide; and 2.00 percent zirconium silicate. The copper powder had an average particle size of about 3 micrometers. The copper powder, devitrifying glass frit, bismuth oxide and/or cuprous oxide made up the solid ingredients of the copper conductor inks. The organic medium was based upon a 62.5 percent mixture of 6 parts ethyl cellulose and 100 parts Texanol, 17.9 percent of a mixture of 10 parts Thixatrol and 100 parts Texanol, 17.8 percent of Texanol and 1.8 percent of a surfactant, Troysol 98C. All of the formulations shown in the Table contained 85.3 percent solids and 14.7 percent organic medium.

TABLE

| INK | Cu | Devitrifying Glass | COMPOSITION (inorganics) wt. % | | PEEL STRENGTH lbs. | |
|---|---|---|---|---|---|---|
| | | | $Bi_2O_3$ | $Cu_2O$ | Alumina Substrate | Dielectric Layer |
| A | 93.75 | 4.69 | 1.56 | — | 1.0 | <1.0 |
| B | 92.3 | 4.6 | 3.1 | — | 2.5 | 1.0 |
| C | 91.0 | 4.5 | 4.5 | — | 3.0 | 1.4 |
| D | 92.31 | 3.84 | 3.08 | 0.77 | 3.8 | 1.8 |
| E | 92.31 | 3.08 | 3.08 | 1.53 | 4.2 | 2.4 |
| F | 90.9 | 3.03 | 4.54 | 1.53 | 5.4 | 3.2 |

The prepared inks were printed on both an alumina substrate and on a dielectric layer comprising the zinc-magnesium-barium-aluminum-silicate devitrifyng glass frit using conventional screen printing techniques. The copper conductor inks were fired in nitrogen at a peak temperature of 900° for 10 minutes to form a film having a thickness of 15 micrometers. Leads were attached to 2.5×2.5 millimeter copper pads by soldering and then pulled at 90° on the Instron. The peel strengths of the copper conductor inks for both the alumina substrate and the dielectric layers are shown in Table I. These data clearly illustrate that the addition of cuprous oxide and bismuth oxide increased adhesion of the fired copper conductor films on both the alumina substrate and the multilayer dielectric film.

We claim:

1. A copper conductor ink comprising, on a weight basis:

(a) from about 65 to about 85 percent of copper powder;

(b) from about 2 to about 10 percent of a devitrifying glass frit selected from the group consisting of a zinc-calcium-aluminum-silicate glass frit, a zinc-magnesium-barium-aluminum-silicate glass frit and mixtures thereof;
(c) from about 1 to about 8 percent of an adhesion promoting oxide selected from the group consisting of bismuth oxide, cadmium oxide, cuprous oxide, thallium oxide, lead oxide and mixtures thereof; and
(d) from about 5 to about 25 percent of a suitable organic vehicle.

2. A copper ink in accordance with claim 1, wherein the ink comprises, on a weight basis:
(a) from about 75 to about 80 percent of the copper powder;
(b) from about 2.5 to about 5 percent of the glass frit;
(c) from about 0.5 to about 5 percent bismuth oxide;
(d) from about 0.5 to about 3 percent cuprous oxide; and
(e) from about 12 to about 16 percent of the organic vehicle.

3. A copper ink in accordance with claim 2, wherein said zinc-calcium-aluminum-silicate glass frit comprises, on a weight basis:
a) from about 7 to about 12 percent of zinc oxide;
b) from about 25 to about 45 percent of calcium oxide;
c) from about 10 to about 20 percent of aluminum oxide;
d) from about 35 to about 50 percent of silicon dioxide;
e) from 0 to about 2 percent of phosphorus pentoxide; and
f) from 0 to about 5 percent of zirconium silicate.

4. A copper ink in accordance with claim 3, wherein said glass frit comprises, on a weight basis:
a) from about 8 to about 10 percent of zinc oxide;
b) from about 29 to about 38 percent of calcium oxide;
c) from about 11 to about 18.5 percent of aluminum oxide;
d) from about 37 to about 44 percent of silicon dioxide;
e) from about 0.5 to about 1 percent of phosphorus pentoxide; and
f) from about 2 to 3 percent of zirconium silicate.

5. A copper ink in accordance with claim 2, wherein said zinc-magnesium-barium-aluminum-silicate glass frit comprises, on a weight basis:
a) from about 15 to about 25 percent of zinc oxide;
b) from about 10 to about 25 percent of magnesium oxide;
c) from about 3 to about 12 percent of barium oxide;
d) from about 5 to about 20 percent of aluminum oxide;
e) from about 35 to about 50 percent of silicon dioxide;
f) from 0 to about 3 percent of phosphorus pentoxide; and
g) from 0 to about 5 percent of zirconium silicate.

6. A copper ink in accordance with claim 5, wherein said glass frit comprises:
a) from about 16 to about 22 percent of zinc oxide;
b) from about 16 to about 22 percent of magnesium oxide;
c) from about 5 to about 10 percent of barium oxide;
d) from about 8 to about 11 percent of aluminum oxide;
e) from about 39 to about 43 percent of silicon dioxide;
f) from about 1 to about 2 percent of phosphorus pentoxide; and
g) from about 2 to about 3 percent of zirconium silicate.

* * * * *